United States Patent [19]

Flanders

[11] 4,287,235
[45] Sep. 1, 1981

[54] X-RAY LITHOGRAPHY AT ~100 Å LINEWIDTHS USING X-RAY MASKS FABRICATED BY SHADOWING TECHNIQUES

[75] Inventor: Dale C. Flanders, Lexington, Mass.
[73] Assignee: Massachusetts Institute of Technology, Cambridge, Mass.
[21] Appl. No.: 43,309
[22] Filed: May 29, 1979
[51] Int. Cl.³ .......................... B05D 3/10; G21K 3/00
[52] U.S. Cl. ..................................... 427/160; 264/129
[58] Field of Search ........................ 427/160; 264/129
[56] References Cited

U.S. PATENT DOCUMENTS 4,035,522   7/1977   Hatzakis ............................... 427/160

Primary Examiner—James R. Hoffman
Attorney, Agent, or Firm—Arthur A. Smith, Jr.; Charles Hieken

[57] ABSTRACT

A new technique for fabricating high contrast X-ray masks with precisely controlled linewidths of less than 100 Å is described. The technique is based on the deposition at an oblique angle ("shadowing") of X-ray absorber material onto relief structures of triangular or square cross-section in a polyimide plastic membrane. Precise linewidth control is possible because shadowing angle, absorber thickness and relief structure can be precisely determined. The smooth and well-controlled triangular cross-section structures required are produced in silicon by anisotropic chemical etching and then transferred to polyimide by molding. The square structures are made by reactive-ion-etching $SiO_2$ with $CHF_3$ and are transferred to polyimide by molding. Results of a numerical model of carbon K (45 Å) X-ray exposures in PMMA of shadowed triangular profile masks are presented which indicate that linewidth control of ±50 Å should be possible for submicrometer period gratings. Scanning electron micrographs of PMMA gratings of 1 μm, 3200 Å and 1968 Å period with linewidths as small as 400 Å are shown. The successful replication of <200 Å linewidth patterns in PMMA using the carbon K X-ray and shadowed square cross-section masks is reported.

7 Claims, 22 Drawing Figures

REMOVE ETCHING MASK

FABRICATE ETCHING MASK

ANISOTROPIC ETCH

REMOVE ETCHING MASK

COAT WITH POLYIMIDE

REMOVE SILICON BY CHEMICAL ETCHING

SHADOW WITH TUNGSTEN

PLOT OF X-RAY ATTENUATION

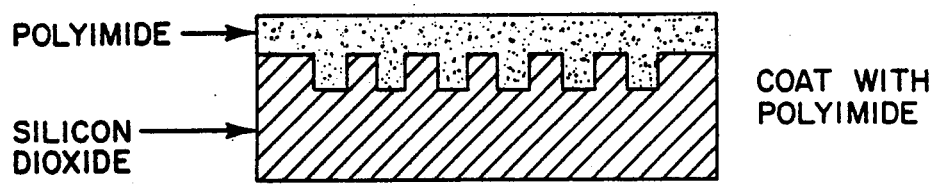
FIG. 7a — COAT WITH POLYIMIDE
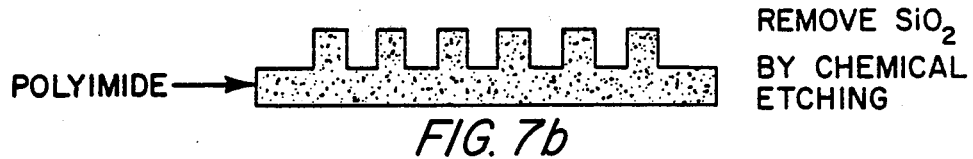
FIG. 7b — REMOVE SiO₂ BY CHEMICAL ETCHING
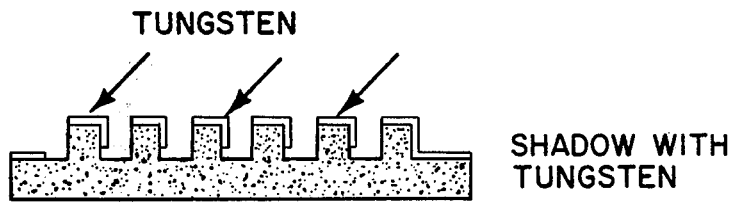
FIG. 7c — SHADOW WITH TUNGSTEN
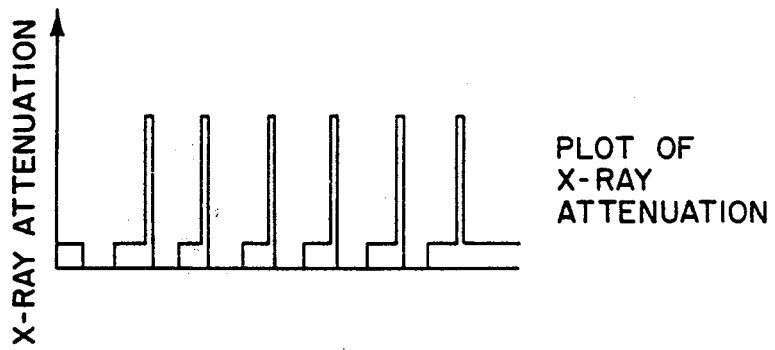
FIG. 7d — PLOT OF X-RAY ATTENUATION

X-RAY LITHOGRAPHY AT ~100 Å LINEWIDTHS USING X-RAY MASKS FABRICATED BY SHADOWING TECHNIQUES

The Government has rights in this invention pursuant to Contract Number AF19(628)-78-C-0002 awarded by the U.S. Department of the Air Force.

BRIEF DESCRIPTION OF THE DRAWINGS

FIG. 3b shows the carbon K X-ray attenuation at normal incidence for the mask structure shown in FIG. 3a;

FIG. 3c shows the calculated PMMA profile for several development times for a simulated carbon K X-ray exposure using the mask of FIG. 3a;

FIGS. 7a-7c illustrate the sequence of steps for fabricating a shadowed square-wave profile polyimide X-ray mask;

FIG. 7d shows the resulting carbon K X-ray attenuation of the mask of FIG. 7c;

FIG. 8b is a perspective view of the original PMMA structure deduced from the micrograph of the carbon replica of FIG. 8a.

DETAILED DESCRIPTION OF PREFERRED EMBODIMENTS

Submicrometer spatial period grating patterns have found wide application in several fields. Some recent examples include optical and X-ray diffraction gratings[1,2], integrated optical devices[3], liquid crystal displays[4], and oriented crystal growth on amorphous substrates[5]. In most cases, submicrometer spatial period grating patterns were generated using holographic lithography, although some work has been done using scanning electron beam lithography (SEBL). Holographic lithography can yield large area gratings with very accurate periodicity and low distortion. However, the ratio of linewidth to grating period is difficult to control and the rounded resist profiles, which are characteristic of holographic lithography, often limit subsequent processing. Gratings generated by SEBL do not generally have the same freedom from distortion over large areas that is characteristic of holographic gratings. Under certain conditions nearly vertical walled resist profiles can be obtained with SEBL, however, precise control of the ratio of linewidth to period of submicrometer period gratings is difficult because of limited contrast in the exposure caused by electron backscattering. Writing times also tend to be very long for large area gratings. X-ray lithography using PMMA resist and the carbon K (45 Å) X-ray is capable of producing vertical walled resist profiles[6] in thick PMMA and is believed to be capable of 50 Å resolution[7,8]. Thus the problem of exposing grating patterns of precisely controlled linewidths comes down to one of making an X-ray mask with sufficient contrast and the proper linewidths.

In this paper a new technique for fabricating high contrast X-ray masks with precisely controlled linewidths as small as 100 Å is described. The technique is based on the deposition at an oblique angle ("shadowing") of X-ray absorber material onto relief structures of triangular and square cross-section in a polyimide membrane. The success of the technique depends on the perfection of the relief structures. Extremely smooth and reproducible triangular cross-section surface relief structures can be fabricated in single-crystal silicon by anisotropic chemical etching[9], and square cross-section surface relief structures with smooth vertical sidewalls and sharp corners can be fabricated in silicon dioxide by reactive-ion-etching in $CHF_3$ gas[6]. These structures can then be transferred to a thin polyimide plastic membrane by molding. In the case of the triangular cross-section the linewidth of the final pattern is precisely determined by the shadowing angle. For the square cross-section the thickness of the absorber material on the vertical sidewall determines the linewidth.

Figure 1A:
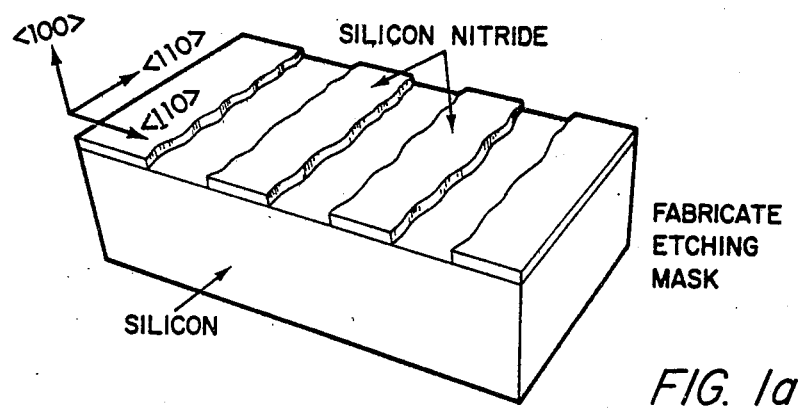
FIGS. 1a-1c illustrate the sequence of steps to fabricate a precisely defined triangular profile surface relief structure in single crystal silicon by an isotropic etching.
Figure 1B:
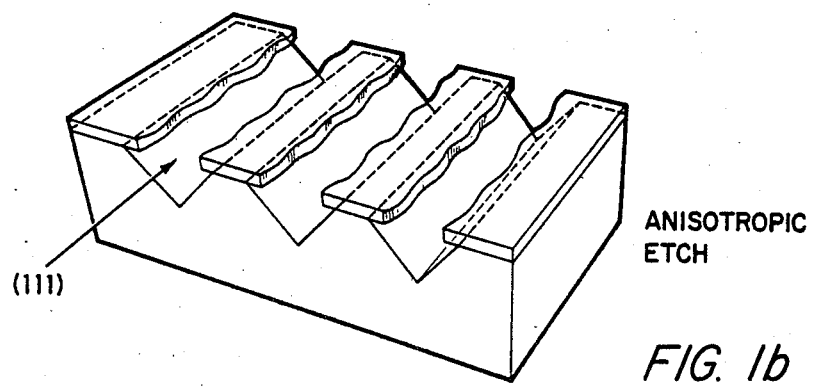
Figure 1C:
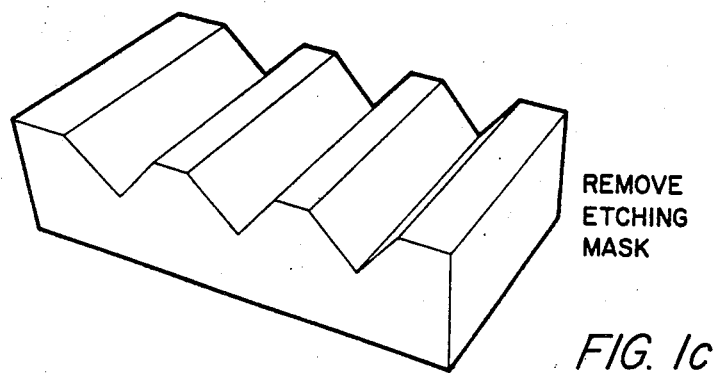
Figure 2A:
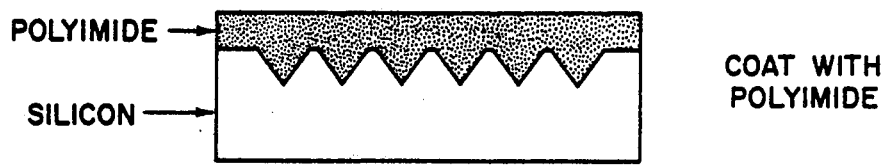
FIGS. 2a-2c illustrate the fabrication procedure for shadowed triangular profile polyimide membrane X-ray mask.
Figure 2B:
Figure 2C:
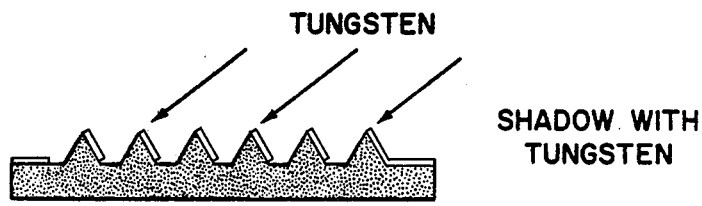
Figure 2D:
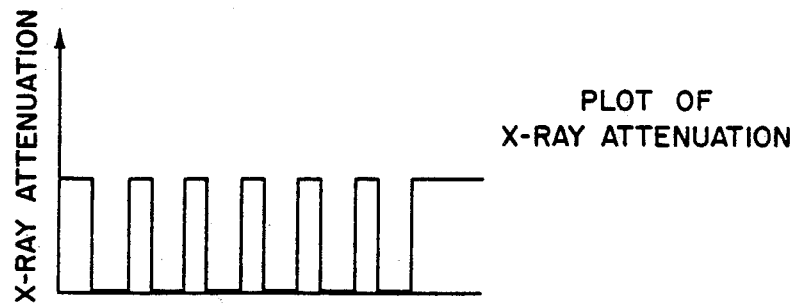
FIG. 2d shows the resulting carbon K X-ray attenuation provided by the structure of FIG. 2c.

The procedure for fabricating triangular surface relief structures silicon is shown in FIGS. 1a-1c and FIGS. 2a-2c. A (100) oriented silicon wafer is coated with ~200 Å of $Si_3N_4$ by chemical vapor deposition and a 50 Å thick layer of chromium is evaporated onto the $Si_3N_4$. A grating pattern with the grating lines parallel to the <110> direction in the silicon, is exposed in ~750 Å of Shipley AZ-1350B photoresist using holographic lithography. The chromium is then chemically etched[10], the $Si_3N_4$ is reactive ion etched in a $CHF_3$ plasma using the chromium as a mask, and finally the chromium is chemically removed. The resulting structure is depicted in FIG. 1a. Although the period of the grating is precisely controlled by the configuration of the holographic lithography system the $Si_3N_4$ grating linewidth can vary considerably over the sample and the line edges can be quite rough. The sample is immersed in a potassium hydroxide solution which etches in the <111> direction in the silicon much more slowly than all other directions[9]. Very smooth (111) plane facets, whose angle of intersection (70.5°) is precisely determined by the crystal structure, rapidly form and the etching essentially ceases once the structure in FIG. 1b is achieved. The $Si_3N_4$ is removed in concentrated hydrofluoric acid. The relief structure in the silicon surface is covered with a liquid polyimide plastic[11] as shown in FIG. 2a. The plastic is polymerized by heating and removed from the silicon mold by peeling after very brief immersion in diluted HF or by etching away the substrate in 96% HF, 4% HNO$_3$. The polyimide membrane surface relief structure is mounted on a metal or plastic ring and shadowed with an X-ray absorber material as shown in FIG. 2c. Tungsten was chosen as the absorber material because it has a large X-ray absorption of 158 db/mm[12] at the carbon X-ray and has a small grain size. Obviously, the linewidth of the projection of the X-ray absorber pattern can be varied by choosing the shadowing angle.

Figure 3A:
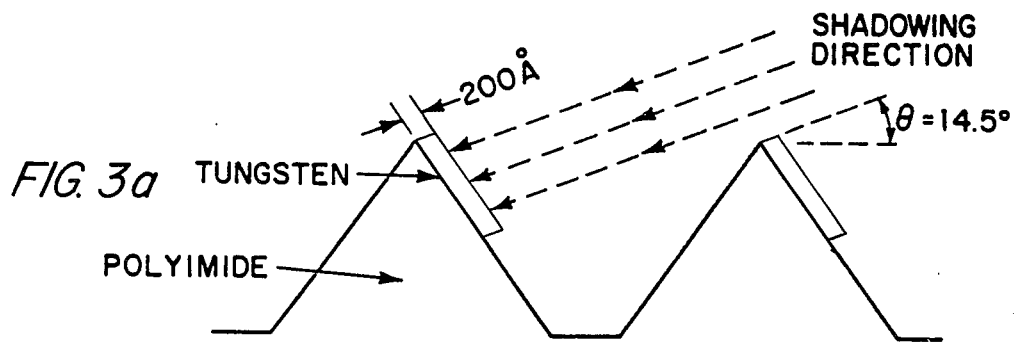
FIG. 3a is a schematic representation of a 3200 Å period triangular profile X-ray mask shadowed at 19.5° with 200 Å of tungsten.
Figure 3B:
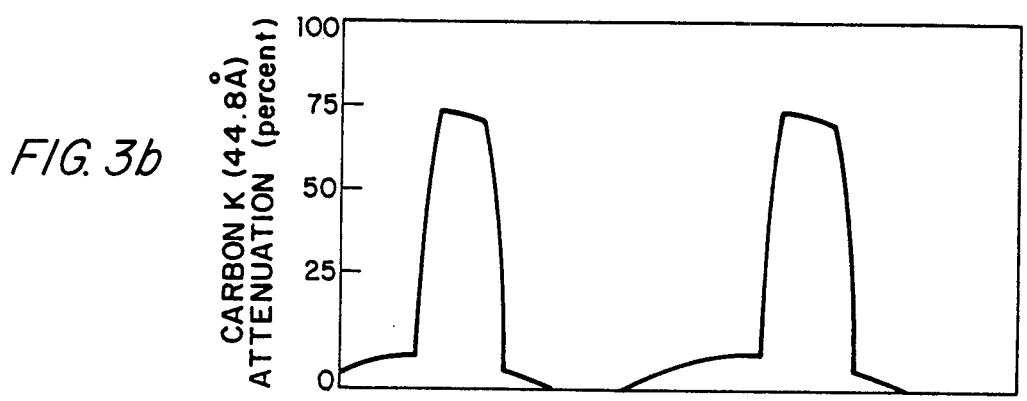
Figure 3C:
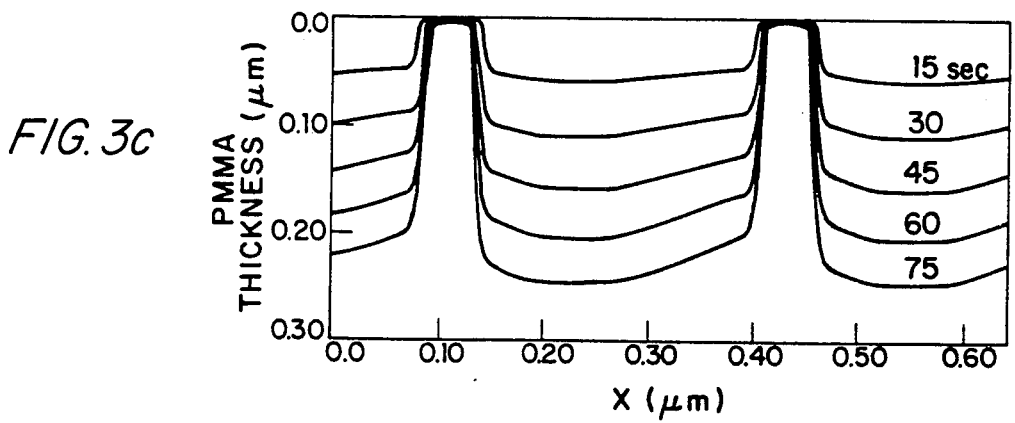

FIG. 3a shows the mask structure which is obtained when a 3200 Å period triangular profile polyimide grating is shadowed with 200 Å of tungsten at 14.5°. The attenuation of carbon K X-rays passing through the mask at normal incidence is plotted in FIG. 3b. A simulation of the cross-sectional profile that would be developed in a PMMA resist film based on the data in FIG. 3b is shown in FIG. 3c. Results for several development times are shown. Note the sharp vertical sidewalls and small change in linewidth with development time. The PMMA profile is calculated numerically by assuming that development is a simple surface etching process in which the etching rate at any point is proportional to the 3.4 power of the energy absorbed in the PMMA at that point[13], diffraction is neglected. This development model is believed to be qualitatively correct for PMMA for carbon K X-ray exposure and a developer consisting of 40% methyl isobutyl ketone (MIBK) and 60% isopropyl alcohol (IPA). (In this and in all our work to date we use PMMA with an average molecular weight of 950,000, and take certain steps[13] to remove any low molecular weight fragments prior to use.) A simple empirical expression for the linewidth of the final PMMA grating which is valid for a limited range of PMMA thicknesses can be obtained. To determine the exact profile which would be obtained for any particular shadowed triangular profile mask a full simulation is necessary. Assuming a PMMA thickness of ~2000 Å, a tungsten thickness of ~200 Å, and a development latitude of a factor of two, the linewidth, l, in Å for a grating period, d, in Å is given ±50 Å by $$l = d \frac{\tan \theta}{\tan \theta + \sqrt{2}} - 100 \text{ Å}$$

The linewidths that can be obtained directly by shadowing triangular cross-section masks range from near zero, obtained by shadowing at a very shallow angle, to a maximum determined by the total width of the angled sidewalls of the triangular polyimide structure. The opening can be no smaller than the flat portion of the relief structure. The largest linewidth is obtained by shadowing both sides of the structure. Larger linewidth to period ratios (i.e., smaller spaces) can be obtained by a two step process. First a narrow linewidth X-ray mask is made by shadowing a triangular profile polyimide mask. This mask is then replicated and the resulting PMMA structure used to produce a reversed contrast mask by liftoff or plating.

Figure 4:
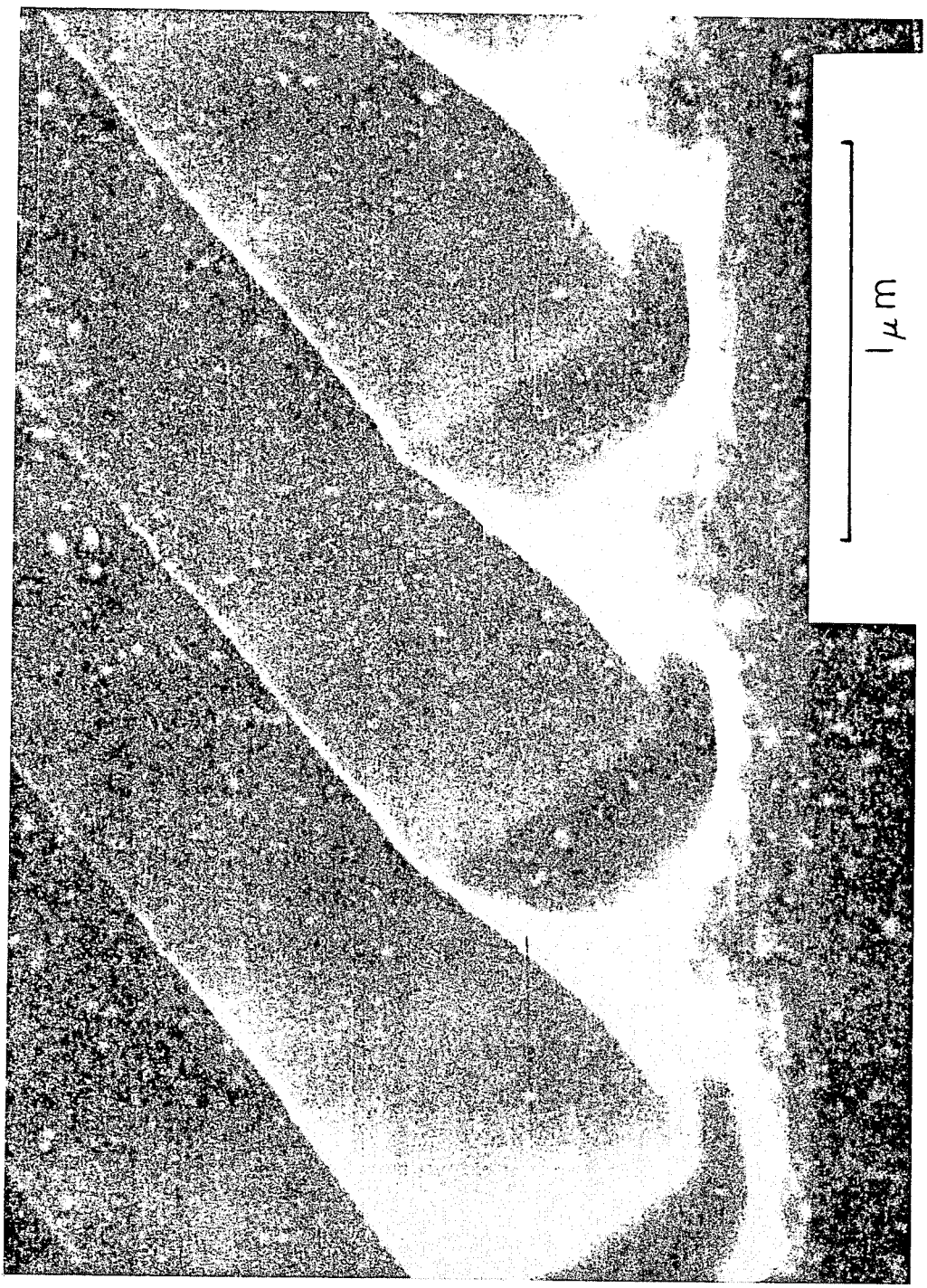
FIG. 4 is an SEM micrograph of a 1 micrometer period relief structure fabricated in polyimide by the process illustrated in FIGS. 1a-1c and FIGS. 2a-2c.
Figure 5A:
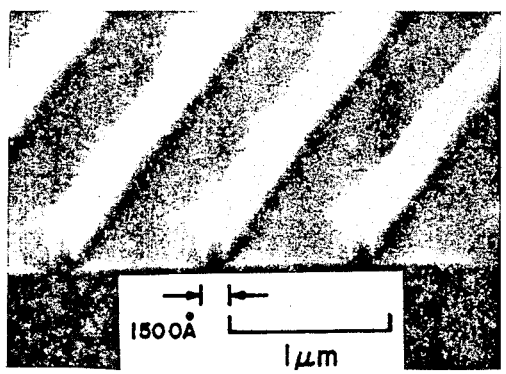
FIGS. 5a-5c are SEM micrographs of 1 micrometer period PMMA gratings on amorphous $SiO_2$ substrates produced by carbon K X-ray lithographic replication of 1 micrometer period triangular profile polyimide masks shadowed with 200 Å of tungsten at 19°, 33° and both sides at 33°, respectively.
Figure 5B:
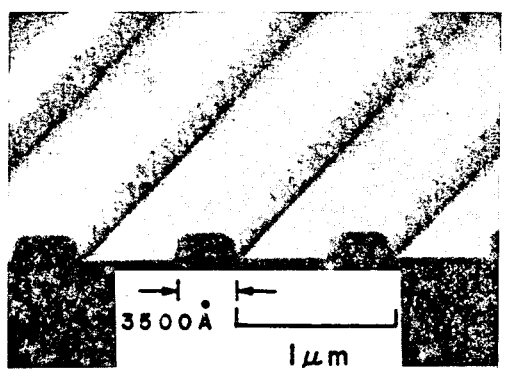
Figure 5C:
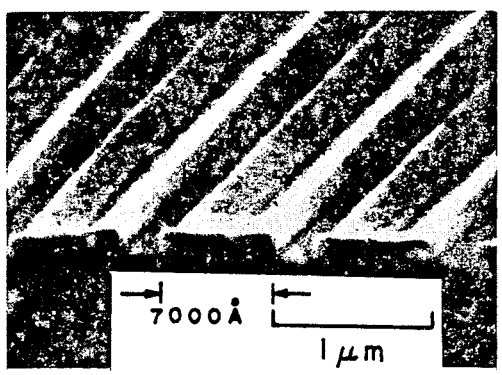
Figure 6A:
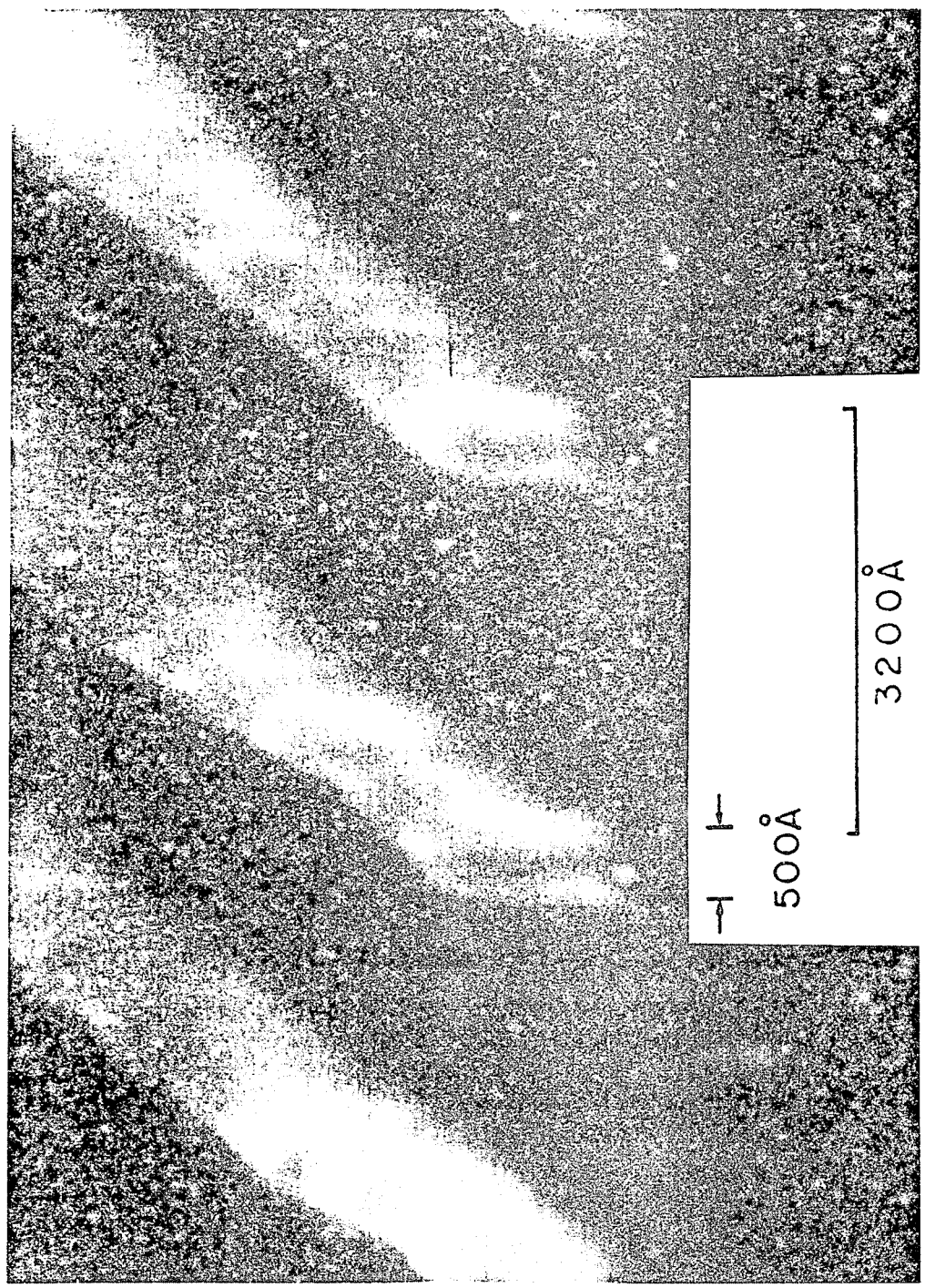
FIGS. 6a and 6b are SEM micrographs of PMMA gratings on amorphous $SiO_2$ substrates produced by carbon K X-ray replication of shadowed triangular profile polyimide membrane X-ray masks for (a) a 3200 Å period shadowed at 19.5° with 200 Å of tungsten, and (b) a 1968 Å period shadowed at 25.2°, respectively.
Figure 6B:
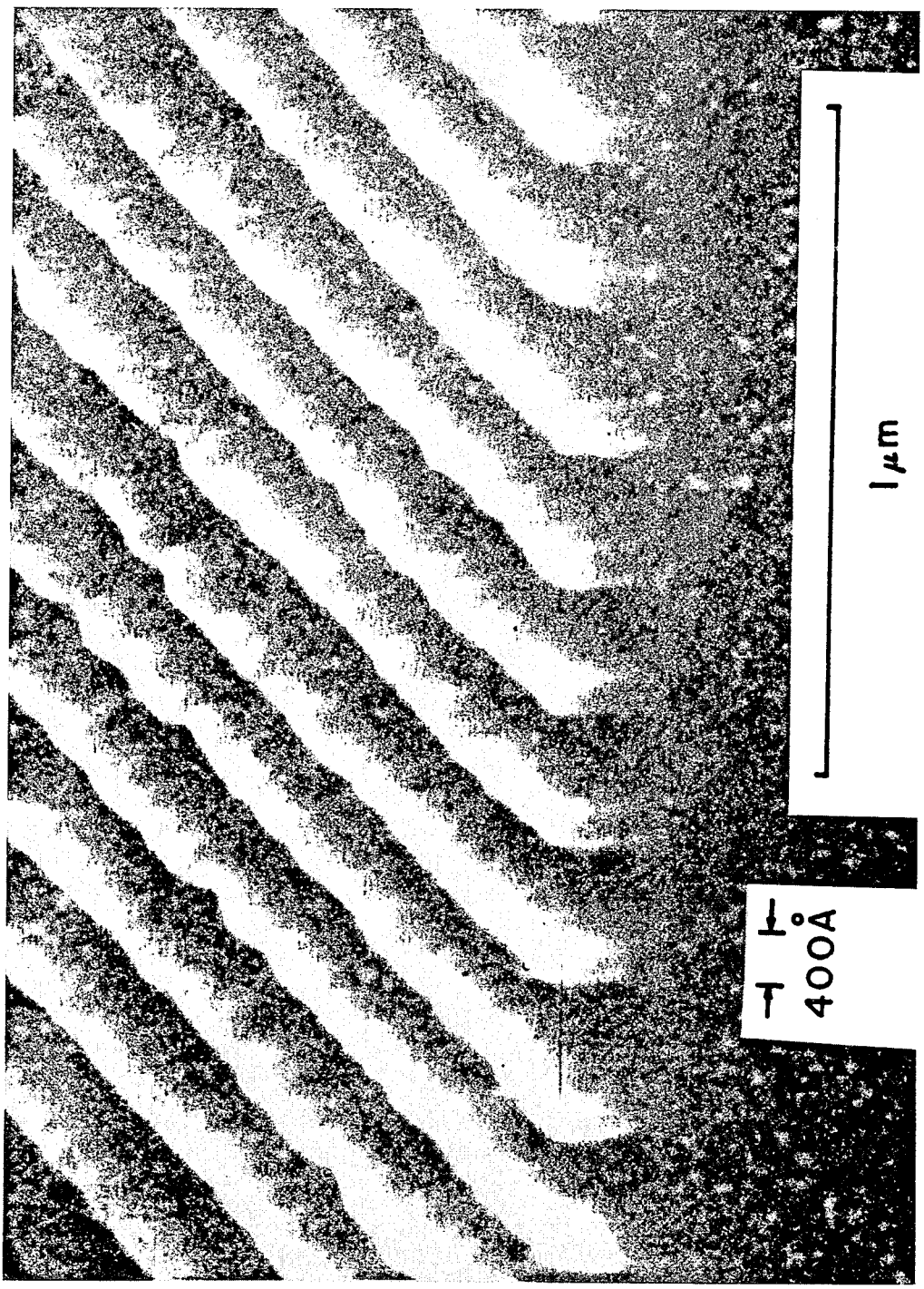

FIG. 4 shows an SEM micrograph of a 1 μm period triangular profile relief structure in a 1 μm thick polyimide membrane made by the process depicted in FIGS. 1 and 2. One area of this structure was shadowed at 19° with 200 Å of tungsten, another area was shadowed at 33° with 200 Å of tungsten, and a third area was shadowed from both sides at 33°. The resulting mask was then replicated in PMMA using the carbon K X-ray. The mask and substrate were held in intimate contact during replication using an electrostatic hold down scheme[14] in which a voltage is applied between the mask and substrate (usually a SiO$_2$ coated silicon wafer). The mask was made conductive by evaporating a thin layer of aluminum on the smooth side of the polyimide membrane. The carbon K X-ray source was a conventional electron bombardment type operated at 4.7 Kv at 400 watts with a spot diameter of ~1 mm at a distance of 6 cm from the substrate. Exposure times were ~150 minute giving a development rate of 33 Å/sec in 40% MIBK and 60% IPA. The resulting 1500 Å, 3500 Å and 7000 Å linewidth structures are shown in FIGS. 5a–5c, respectively. FIG. 6a shows an SEM micrograph of a 3200 Å period grating having a 500 Å linewidth which was exposed in 2000 Å of PMMA using a triangular cross-section mask shadowed with 200 Å of tungsten at 19.5°. FIG. 6b shows an SEM micrograph of a 400 Å linewidth grating having a 1968 Å period which was exposed using a mask shadowed with 200 Å of tungsten at 25.2°. The linewidths obtained agree closely with the calculated values.

Figure 8B:
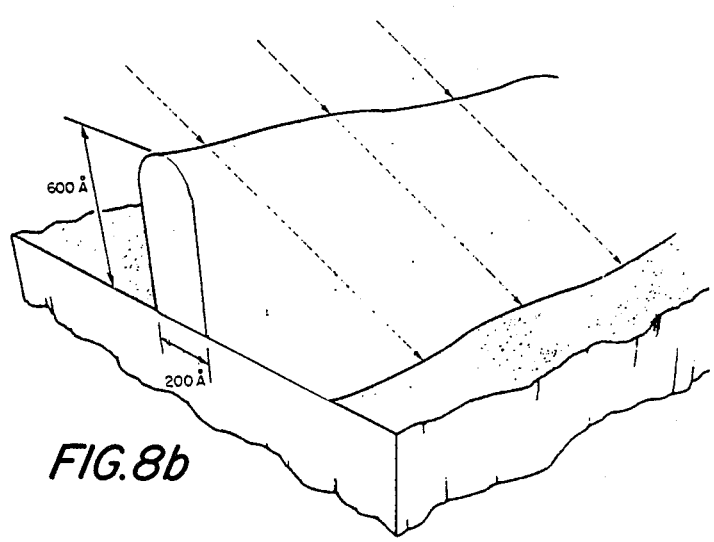
Figure 8A:
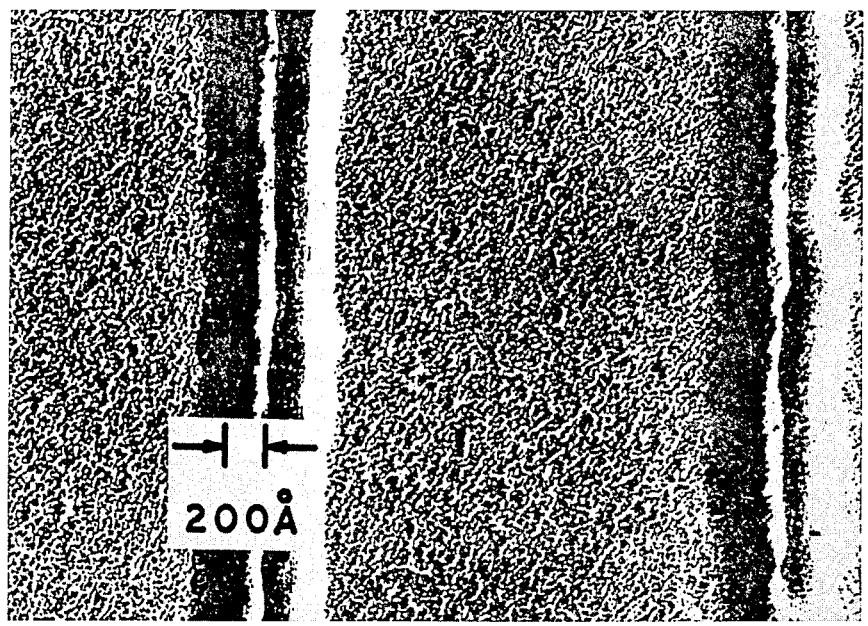
FIG. 8a is a transmission electron micrograph of a tungsten shadowed carbon replica of a 200 Å linewidth 600 Å high PMMA structure exposed with the carbon K X-ray on a thick $SiO_2$ substrate using a 3200 Å period shadowed square wave polyimide membrane X-ray mask of the type shown in FIG. 7c.

For linewidths smaller than 400 Å it is more appropriate to fabricate the X-ray mask by shadowing a square-wave cross-section relief structure. This mask fabrication procedure is illustrated in FIGS. 7a–7c. A square-wave surface relief structure is first fabricated in SiO$_2$ by methods described in an earlier paper[6]. A polyimide replica of the structure is shadowed at an angle yielding the mask structure shown in FIG. 7c. The relative X-ray attenuation of the wide and narrow regions can be such that by overexposure and/or overdevelopment only the narrow high contrast region of the mask will be replicated in PMMA. A 3200 Å period square wave structure was made in polyimide by the process shown in FIGS. 7a–7c and shadowed at an angle of 30° with 200 Å of tungsten yielding a mask with a 180 Å wide linewidth and 8 db of contrast. This mask was replicated in 600 Å thick PMMA using the carbon K X-ray source described above. To view the results of such a high resolution exposure, transmission electron microscopy (TEM) is preferred over the more common scanning electron microscopy (SEM) because of the much higher resolution of the former. FIG. 8a shows a TEM micrograph of a 600 Å high, 200 Å wide line which resulted from the exposure. To make the micrograph, a tungsten shadowed carbon replica was made of the relief structure exposed in the PMMA. FIG. 8b is a perspective view of the structure as determined from the micrograph.

Because extremely smooth vertical sidewalls can be obtained in square-wave relief structures, masks with linewidths smaller than 100 Å can be made. By shadowing such structures alternately with tungsten and a X-ray transparent material such as carbon, high contrast X-ray masks with lines and spaces less than 100 Å in width can be made. Such masks are ideally suited for investigating the ultimate resolution of X-ray lithography and for generating simple device geometries. Using a multiple shadowed square-wave mask, 175 Å lines and spaces have been replicated in PMMA with the carbon K X-ray. Details of this research are given elsewhere[15].

A new technique for producing high contrast X-ray masks with precisely controlled linewidths has been demonstrated. Soft X-ray replication of 200 Å linewidths in PMMA on a thick $SiO_2$ substrate is reported. This is the smallest linewidth achieved by X-ray lithography to the present and is the smallest linewidth structure produced by any lithographic technique on a thick substrate. Not only does this new mask fabrication technique provide a means of testing the ultimate resolution of X-ray lithography, it also opens the possibility of new classes of devices because of the small linewidths and unprecedented linewidth control which can be attained.

References

1. Gunter Schmahl and Dietbert Rudolph, *Progress in Optics* Vol. XIV, (North Holland, Amsterdam, 1976).
2. H. Branninger, P. Predehl and K. P. Beuermann, Appl. Opt. 18, 368 (1979).
3. A Yariv, Sci. Amer. 240, 64–72 (1979).
4. D. C. Flanders, D. C. Shaver and Henry I. Smith, Appl. Phys. Lett. 32, 597 (1978).
5. Henry I. Smith and D. C. Flanders, Appl. Phys. Lett. 32, 349 (1978).
6. D. C. Flanders, Henry I. Smith, H. W. Lehmann, R. Widmer and D. C. Shaver, App. Phys. Lett. 32, 112 (1978).
7. R. Feder, E. Spiller and J. Topalian, J. Vac. Sci. Technol 12, 1332 1975.
8. R. Feder, E. Spiller, J. Topalian and A. N. Broers, Science, 197, 259 (1977).
9. Kenneth E. Bean, IEEE Trans on Electron Devices, ED-25, 1185 (1978).
10. John L. Vossen and Werner Kern, *Thin Film Processing* (Academic, New York, 1978) pg. 465.
11. D. C. Flanders and Henry I. Smith, J. Vac. Sci. Technol. 15, 995 (1978).
12. B. L. Henke and E. S. Ebisu, *Advances in X-ray Analysis* (Plenum, New York, 1974) Vol. 17 p. 150.
13. R. J. Hawryluk, *Energy Dissipation by Electron Beam Scattering in Thin Polymer Films*, Ph.D Thesis, M.I.T., and TR-511, Lincoln Laboratory, M.I.T. Lexington, Mass.
14. D. C. Flanders, *Orientation of Crystalline Overlayers on Amorphous Substrates by Artificially Produced Surface Relief Structures*, Ph.D Thesis 1978, M.I.T., and TR-533, Lincoln Laboratory, MIT Lexington, Mass.
15. D. C. Flanders, Submitted to Appl. Phys. Lett.

I claim:

1. A method for producing X-ray masks with precisely controlled linewidths including the steps of,
   forming a relief structure with a predetermined cross section in a plane perpendicular to the surface of said relief structure; and
   depositing X-ray absorber material onto said relief structure to form a plurality of interleaved regions of alternating high and low X-ray transmissivity for X-rays incident upon said relief structure from a predetermined shadowing direction that forms an oblique angle relative to said surface.

2. A method for producing X-ray masks in accordance with claim 1, and further including the steps of
   an isotropic chemical etching single-crystal silicon to have a triangular cross-section, and transferring said triangular cross-section to a polyimide plastic membrane by molding to form said relief structure.

3. A method for producing X-ray masks in accordance with claim 1, and further including the step of
   reactive-ion-etching silicon dioxide in $CHF_3$ gas to have a square cross-section, and transferring said square cross-section to a polyimide plastic membrane by molding to form said relief structure.

4. A method for producing X-ray masks with precisely controlled linewidths in accordance with claim 1 wherein said step of forming a relief structure includes making said predetermined cross-section triangular.

5. A method for producing X-ray masks in accordance with claim 4, and further including the steps of
   anisotropic chemical etching single-crystal silicon to have said triangular cross-section, and transferring said triangular cross-section to a polyimide plastic membrane by molding to form said relief structure.

6. A method for producing X-ray masks with precisely controlled linewidths in accordance with claim 1 wherein said step of forming a relief structure includes making said predetermined cross section square with vertical side walls; and
   said step of depositing X-ray absorber material includes depositing said X-ray absorber material with a predetermined thickness on said vertical side wall determinative of said line width.

7. A method for producing X-ray masks in accordance with claim 6, and further including the steps of
   reactive-ion-etching silicon dioxide in $CHF_3$ gas to have said square cross-section, and transferring said square cross-section to a polyimide plastic membrane by molding to form said relief structure.

* * * * *